(12) United States Patent
Chung et al.

(10) Patent No.: US 9,218,974 B2
(45) Date of Patent: Dec. 22, 2015

(54) SIDEWALL FREE CESL FOR ENLARGING ILD GAP-FILL WINDOW

(71) Applicant: Taiwan Semiconductor Manufacturing Company, Ltd., Hsin-Chu (TW)

(72) Inventors: Han-Pin Chung, Fongshan (TW); Bor Chiuan Hsieh, Taoyuan County (TW); Shiang-Bau Wang, Pingzchen (TW); Hun-Jan Tao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/912,449

(22) Filed: Jun. 7, 2013

(65) Prior Publication Data

US 2013/0270651 A1    Oct. 17, 2013

Related U.S. Application Data

(62) Division of application No. 12/750,485, filed on Mar. 30, 2010, now abandoned.

(60) Provisional application No. 61/186,954, filed on Jun. 15, 2009.

(51) Int. Cl.

| | |
|---|---|
| *H01L 21/02* | (2006.01) |
| *H01L 21/28* | (2006.01) |
| *H01L 21/768* | (2006.01) |
| *H01L 21/8234* | (2006.01) |
| *H01L 23/485* | (2006.01) |
| *H01L 27/088* | (2006.01) |
| *H01L 29/66* | (2006.01) |

(52) U.S. Cl.
CPC .... *H01L 21/28017* (2013.01); *H01L 21/76829* (2013.01); *H01L 21/76837* (2013.01); *H01L 21/823425* (2013.01); *H01L 21/823475* (2013.01); *H01L 23/485* (2013.01); *H01L 27/088* (2013.01); *H01L 29/66545* (2013.01); *H01L 29/665* (2013.01); *H01L 29/6659* (2013.01); *H01L 2924/0002* (2013.01); *Y10S 438/97* (2013.01)

(58) Field of Classification Search
CPC .................. H01L 21/76837; H01L 21/823475
See application file for complete search history.

(56) References Cited

U.S. PATENT DOCUMENTS

| | | | |
|---|---|---|---|
| 2002/0058402 A1 | 5/2002 | Wieczorek et al. | |
| 2005/0263823 A1* | 12/2005 | Hwang et al. | 257/368 |
| 2006/0189053 A1* | 8/2006 | Wang et al. | 438/197 |
| 2007/0278599 A1 | 12/2007 | Hur | |
| 2008/0064176 A1 | 3/2008 | Chou et al. | |
| 2009/0104741 A1* | 4/2009 | Shin et al. | 438/229 |
| 2010/0314690 A1 | 12/2010 | Chung et al. | |
| 2013/0207065 A1 | 8/2013 | Chiang et al. | |
| 2014/0170846 A1 | 6/2014 | Chung et al. | |

* cited by examiner

*Primary Examiner* — Daniel Whalen
(74) *Attorney, Agent, or Firm* — Slater & Matsil, L.L.P.

(57) ABSTRACT

An integrated circuit structure includes a first gate strip; a gate spacer on a sidewall of the first gate strip; and a contact etch stop layer (CESL) having a bottom portion lower than a top surface of the gate spacer, wherein a portion of a sidewall of the gate spacer has no CESL formed thereon.

20 Claims, 6 Drawing Sheets

US 9,218,974 B2

SIDEWALL FREE CESL FOR ENLARGING ILD GAP-FILL WINDOW

This application claims the benefit of U.S. application Ser. No. 12/750,485 filed on Mar. 30, 2010, entitled "Sidewall-Free CESL for Enlarging ILD Gap-Fill Window," and U.S. Provisional Application No. 61/186,954 filed on Jun. 15, 2009, entitled "Sidewall-Free CESL for Enlarging ILD Gap-Fill Window," which application is hereby incorporated herein by reference.

TECHNICAL FIELD

This invention relates generally to integrated circuits, and more particularly to the gap-filling of inter-layer dielectrics (ILDs) in the manufacturing of integrated circuits.

BACKGROUND

Replacement gates are widely used in the manufacturing of integrated circuits. In the formation of replacement gates, polysilicon gates are formed first, and replaced by metal gates in subsequent process steps. With the using of replacement gates, the gates of PMOS and NMOS devices can have band-edge work functions, so that their performance can be optimized.

The replacement gates typically have great heights, and hence the aspect ratios of the gaps between gate stacks are also high. For example, FIG. 1 illustrates gate polys 102 and 104 adjacent to each other. Gap 106 is thus formed between gate polys 102 and 104. After the formation of gate polys 102 and 104, contact etch stop layer (CESL) 108 may be formed. The formation of CESL 108 adversely results in an increase in the aspect ratio of gap 106.

Referring to FIG. 2, inter-layer dielectric (ILD) 110, often referred to as ILD0, is formed to fill gap 106. In subsequent process steps, gate polys 102 and 104 may be replaced with metal gates. Currently, high-density plasma (HDP) processes are widely used for the ILD0 gap filling process. However, the gap filling capability of HDP is not satisfactory, and hence void 112 may be formed in gap 106. If formed using advanced technologies such as 22 nm or 20 nm technologies, the aspect ratio of gap 106 is particularly high. What is needed, therefore, is a method and structure for overcoming the above-described shortcomings in the prior art.

SUMMARY OF THE INVENTION

According to an embodiment, an integrated circuit structure comprises a first conductive strip, a first spacer on a sidewall of the first conductive strip, a second conductive strip and a second spacer on a sidewall of the second conductive strip. A gap is between the first spacer and the second spacer. The structure further has a contact etch stop layer (CESL) comprising a top portion directly over the first conductive strip and a bottom portion in the gap and disconnected from the top portion, wherein a sidewall of the first spacer does not have any portion of the CESL formed thereon.

An integrated circuit structure according to an embodiment comprises a first gate strip on a substrate, a first spacer on a sidewall of the first gate strip, a second gate strip on the substrate and a second spacer on a sidewall of the second gate strip. A gap is between the first spacer and the second spacer. A contact etch stop layer (CESL) is disposed on the substrate between the first spacer and the second spacer and comprises a bottom portion lower than a top surface of the first spacer. A top surface of the bottom portion of the CESL is higher than a bottom surface of the first spacer and a bottom surface of the second spacer. A portion of a sidewall of the first spacer has no CESL formed thereon.

Other embodiments are also disclosed.

The advantageous features of the embodiments include a reduced aspect ratio of the gap between gate strips. As a result, it is easier to fill the gaps between the gate strips without causing voids.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

A novel integrated circuit structure and a method of forming the same are provided. The intermediate stages of manufacturing an embodiment are illustrated. The variations of the embodiment are then discussed. Throughout the various views and illustrative embodiments, like reference numbers are used to designate like elements.

Figure 1:
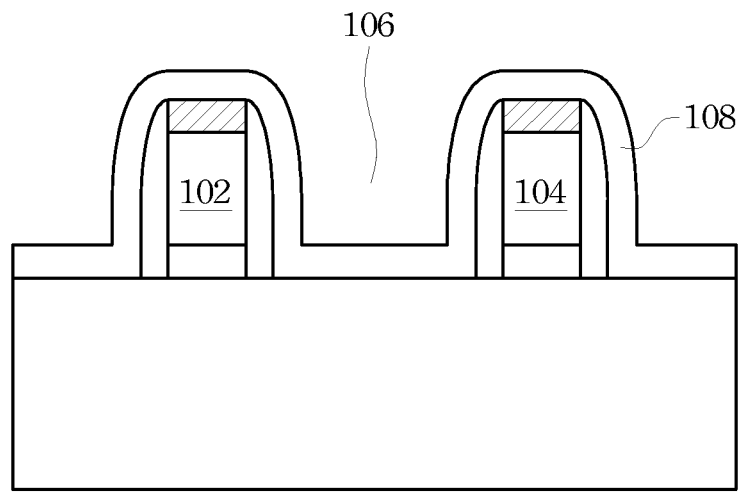
FIGS. 1 and 2 illustrate cross-sectional views of intermediate stages in a conventional manufacturing process of an integrated circuit structure.
Figure 2:
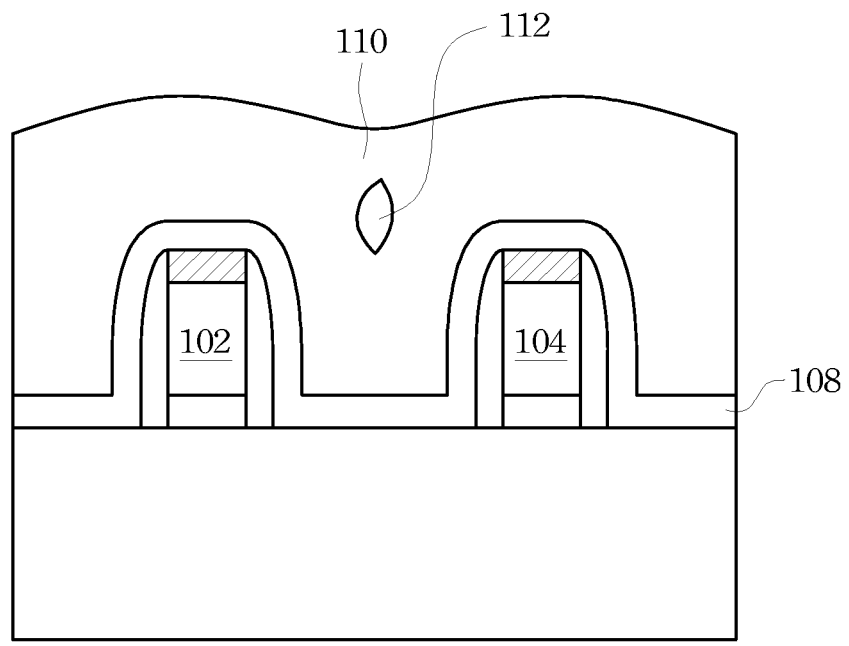
Figure 3A:
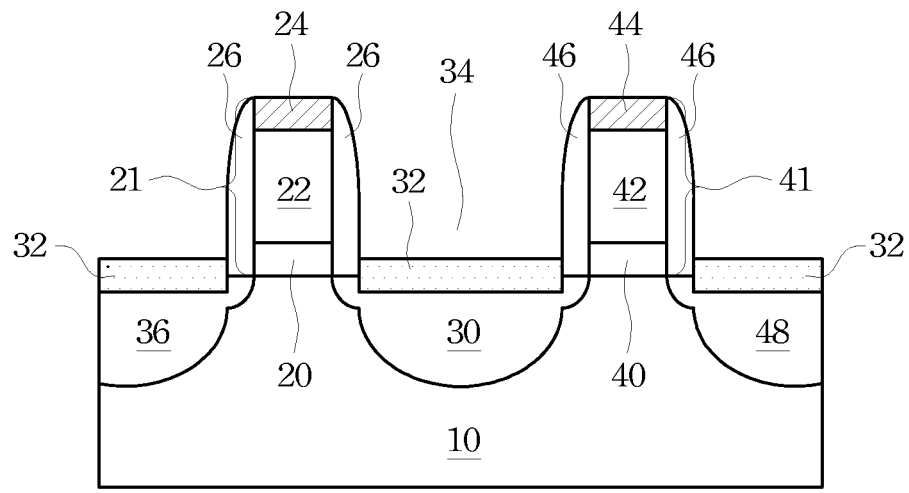
FIGS. 3A through 9 are cross-sectional views and top views of intermediate stages in the manufacturing of an integrated circuit structure in accordance with an embodiment.

FIG. 3A illustrates a cross-sectional view of an integrated circuit structure. Substrate 10 is provided. Substrate 10 may be formed of commonly known semiconductor materials such as silicon, silicon germanium, gallium arsenide, and the like. First gate stack 21 and second gate stack 41 are formed on substrate 10. First gate stack 21 includes gate dielectric 20, gate strip 22, and optional hard mask layer 24. Gate spacers 26 are formed on sidewalls of gate stack 21. Second gate stack 41 includes gate dielectric 40, gate strip 42, and optional hard mask layer 44. Gate spacers 46 are formed on sidewalls of gate stack 41. Gate spacers 26 and 46 are adjacent to each other with gap 34 therebetween.

In an embodiment, gate strips 22 and 42 are formed of polysilicon. In other embodiments, gate strips 22 and 42 are formed of other conductive materials such as metals, metal silicides, metal nitrides, and the like. A common source or a common drain 30 (referred to as a source/drain hereinafter) may be located in substrate 10 and between gate stacks 21 and 41. Source/drain regions 36 and 48 may be formed adjacent to gate stacks 21 and 41, respectively. Further, silicide regions 32 may be formed on source/drain regions 30, 36, and 48. Gate stack 21 and source/drain regions 30 and 36 form a first MOS device, and gate stack 41 and source/drain regions 30 and 48 form a second MOS device.

Figure 3B:
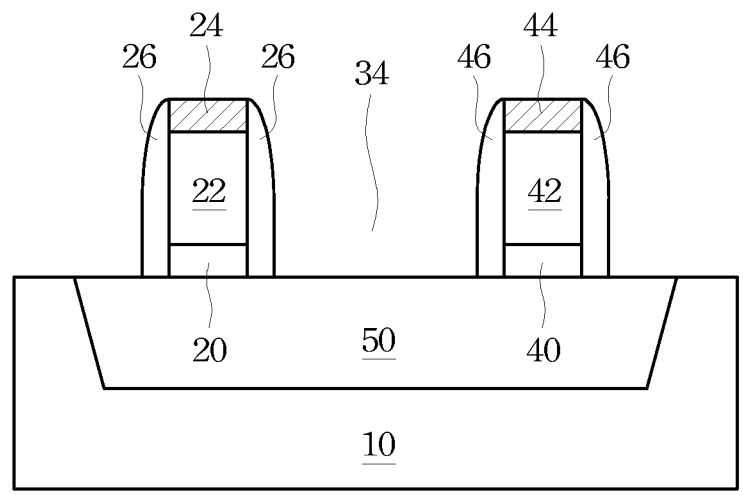
Figure 3C:
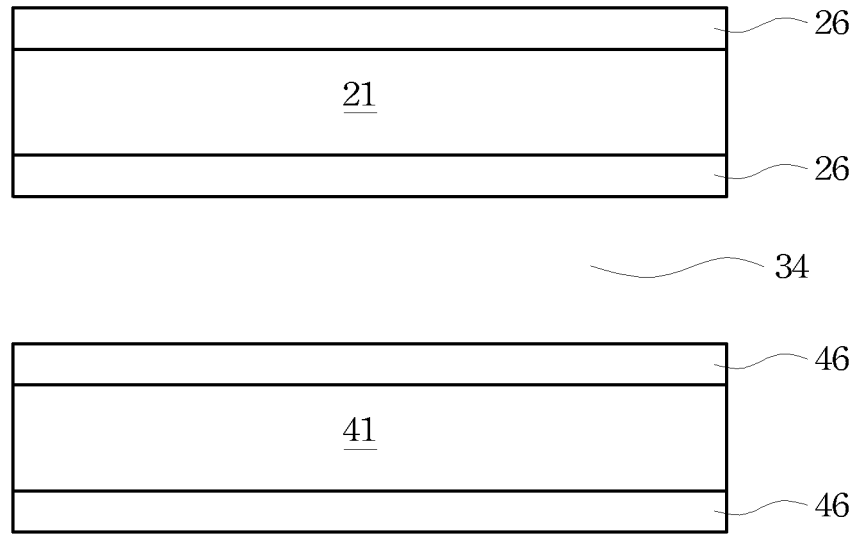

FIG. 3B illustrates an alternative embodiment, wherein gate (poly) strips 22 and 42 are formed directly over shallow trench isolation (STI) region 50. Also, the structure shown in FIG. 3B may be the extension of the structure shown in FIG. 3A. A top view of the structure shown in FIGS. 3A and 3B is illustrated in FIG. 3C.

Figure 4:
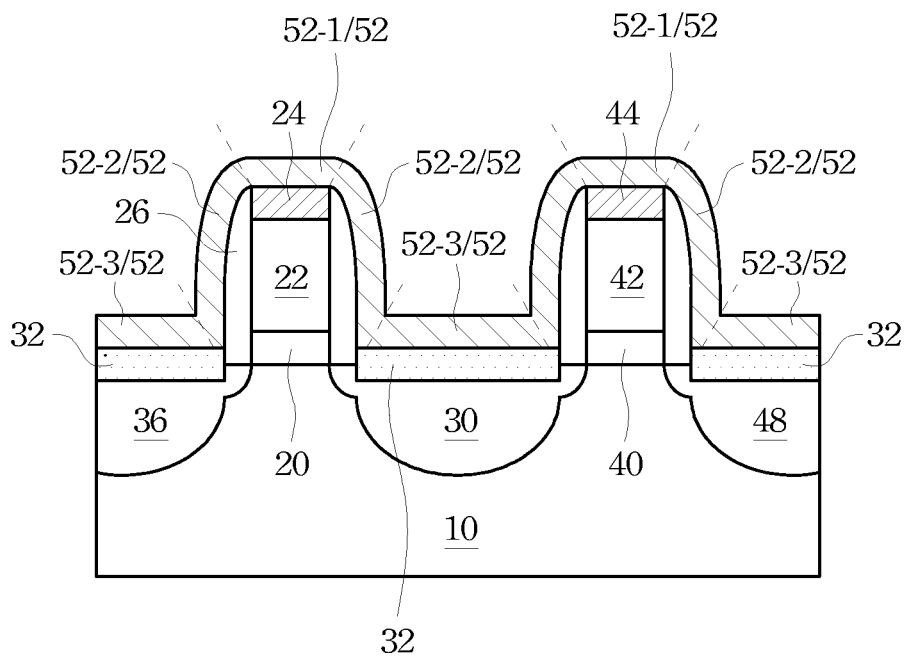

FIG. 4 illustrates the formation of contact etch stop layer (CESL) 52, which may be formed of commonly used CESL materials including, but not limited to, $SiN_x$, $SiO_x$, SiON, SiC, SiCN, BN, SiBN, SiCBN, and combinations thereof. In an embodiment, CESL 52 is formed using plasma enhanced chemical vapor deposition (PECVD), although other methods such as sub atmospheric chemical vapor deposition (SACVD), low pressure chemical vapor deposition (LPCVD), atomic layer deposition (ALD), high-density plasma (HDP), plasma enhanced atomic layer deposition (PEALD), molecular layer deposition (MLD), plasma impulse chemical vapor deposition (PICVD), and the like can also be used.

In an embodiment, CESL 52 includes top portions 52-1, sidewall portions 52-2, and bottom portions 52-3. Top portion 52-1 is located on the top of hard mask layers 24 and 44. Sidewall portions 52-2 are located on the sidewalls of gate spacers 26 and 46. The bottom portions 52-3 are at the bottom of gap 34 and on silicide regions 32. Sidewall portions 52-2 have different characteristics from top portions 52-1 and bottom portions 52-3. In an embodiment, sidewall portions 52-2 have a density lower than, for example, about 80% percent, of the densities of top portions 52-1 and bottom portions 52-3.

An exemplary formation process of CESL 52 is performed using PECVD. The PECVD for forming CESL 52 may include generating plasma using a low-frequency energy source that provides a low-frequency energy, wherein the frequency of the low-frequency energy may be lower than about 900 KHz. An exemplary low frequency is about 350 KHz. Further, for generating the plasma, a high-frequency energy source is also used to provide a high-frequency energy. The frequency of the high-frequency energy may be greater than about 900 KHz. An exemplary high frequency is 13.56 MHz. Throughout the description, the power provided through the low-frequency energy source is referred to as a low-frequency power, while the power provided through the high-frequency energy source is referred to as a high-frequency power. The high-frequency power and the low-frequency power may be provided simultaneously in the formation of CESL 52. It is observed that the low-frequency power has the effect of bombarding CESL 52, resulting in a greater density of the horizontal portions (top portions 52-1 and bottom portions 52-3) of CESL 52, while sidewall portions 52-2 are affected less by the bombardment, and hence have a lower density than that of top portions 52-1 and bottom portions 52-3. The low-frequency power may be increased relative to the high-frequency power to increase the densifying effect of top portions 52-1 and bottom portions 52-3. In the embodiment wherein both the high-frequency energy and the low-frequency energy are provided, a ratio of the high-frequency power to the low-frequency power may be lower than about 1, lower than about 0.8, or even lower than about 0.1.

Figure 5A:
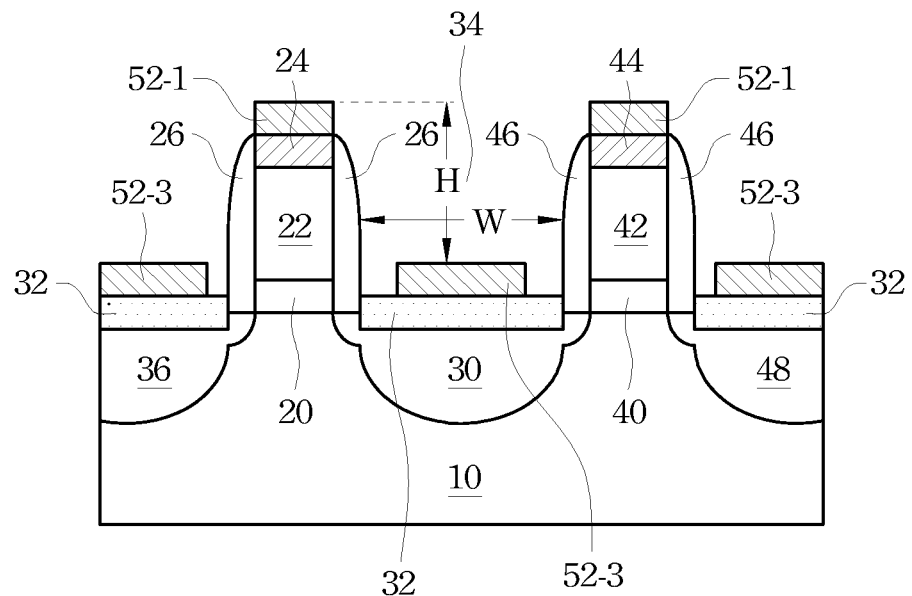
Figure 5B:
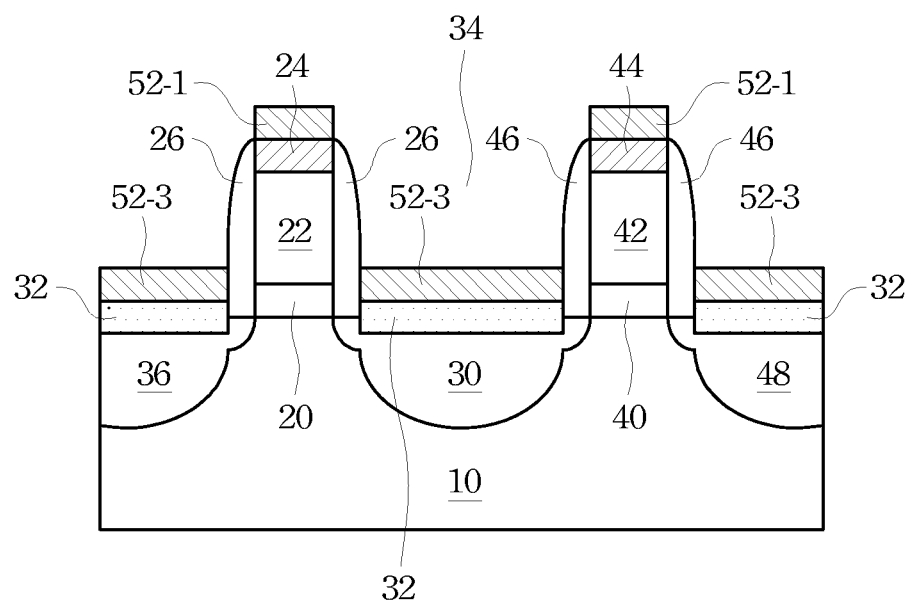

Next, an isotropic etch is performed to remove sidewall portions 52-2 of CESL 52, while top portions 52-1 and bottom portions 52-3 are not removed. In an embodiment in which CESL 52 is formed of silicon nitride, the isotropic etch may be a wet etch using phosphoric acid. Since sidewall portions 52-2 have a lower density, they have a greater etching rate than that of top portions 52-1 and bottom portions 52-3. In the isotropic etch, top portions 52-1 and bottom portions 52-3 will also be reduced. However, the isotropic etch may be controlled so that at least some of top portion 52-1 and bottom portion 52-3 remain. FIG. 5A illustrates one embodiment wherein the remaining bottom portions 52-3 are spaced apart from spacers 26 and/or 46. FIG. 5B illustrates another embodiment, wherein remaining bottom portions 52-3 are in contact with spacers 26 and/or 46. The resulting top portions 52-1 may have a thickness greater than the thickness of bottom portions 52-3.

Figure 6:
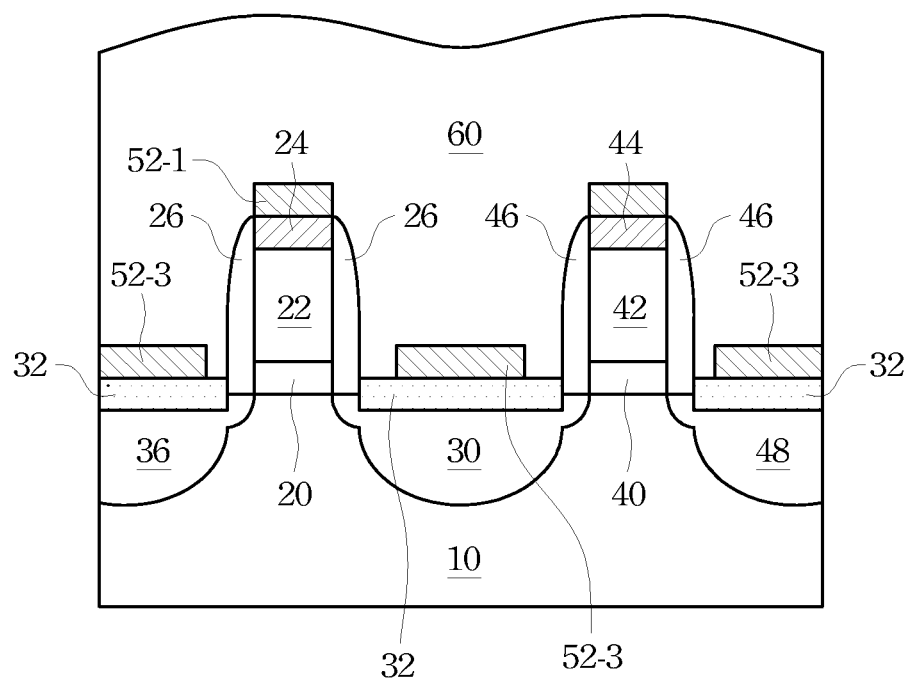

As a result of the removal of sidewall portions 52-2 of CESL 52, the aspect ratio (the ratio of height H to width W; refer to FIG. 5A) of gap 34 is reduced, and hence the possibility of forming voids in the subsequent gap-filling process is reduced. FIG. 6 illustrates the filling of inter-layer dielectric (ILD) 60, which is also referred to as ILD0 since an additional ILD will be formed thereon. ILD 60 may be formed of commonly used CESL materials including, but not limited to, $SiN_x$, $SiO_x$, SiON, SiC, SiBN, SiCBN, and combinations thereof. In an embodiment, ILD 60 is formed using HDP, although other methods such as SACVD, LPCVD, ALD, PEALD, PECVD, MLD, PICVD, spin-on, and the like may also be used.

Figure 7:
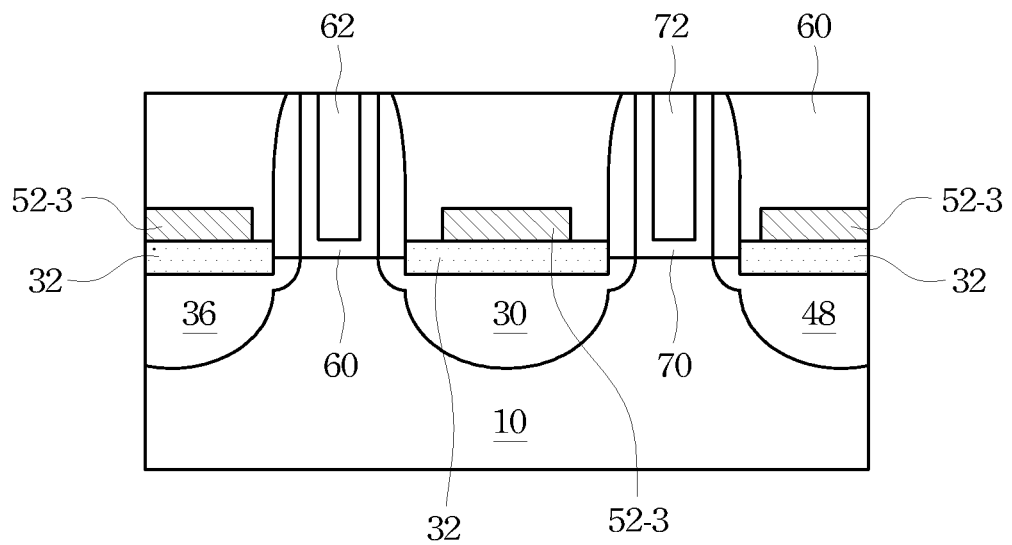

Referring to FIG. 7, a chemical mechanical polish (CMP) may be performed to remove hard mask layers 24 and 44 and top portions 52-1. In alternative embodiments, the CMP may be performed using hard mask layers 24 and 44 as CMP stop layers. Next, gate dielectrics 20 and 40 and gate strips 22 and 42 are replaced by gate dielectrics 60 and 70 and metal gates 62 and 72. The formation processes are known in the art, and hence are not repeated herein. As a result, the gate stacks shown in FIG. 3B will also be replaced by gate dielectrics 60 and 70 and metal gates 62 and 72.

Figure 8:
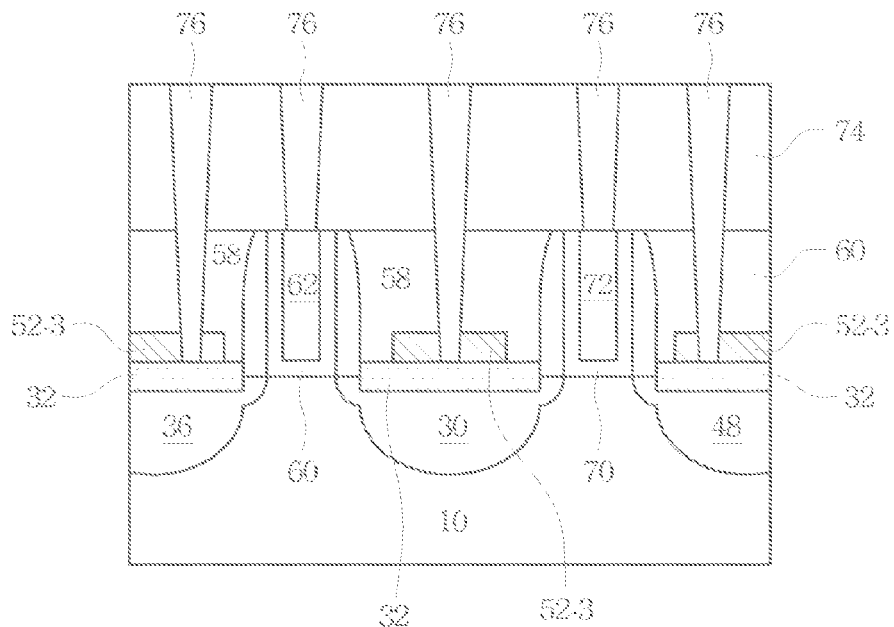

In subsequent process steps, as shown in FIG. 8, an additional ILD 74, also known as ILD1, is formed over ILD 60. The process is then continued by forming contact openings in ILDs 74 and 60 and filling the contact openings to form contact plugs 76. In the formation of the contact openings, bottom portions 52-3 of CESL 52 are used to stop the etching.

Figure 9:
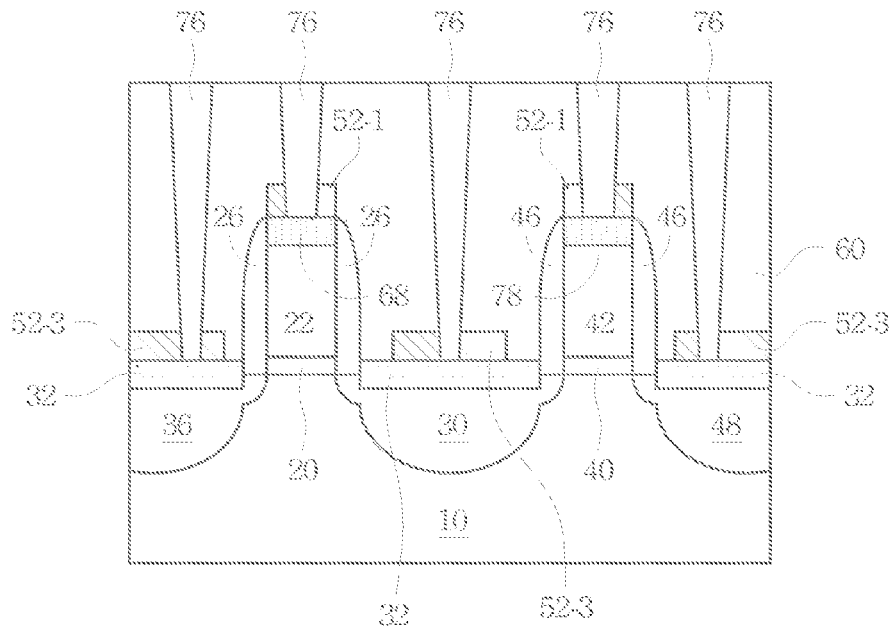

In alternative embodiments, as shown in FIG. 9, mask layers 24 and 44 (refer to FIG. 3A) are not formed, or are formed but removed before the formation of silicide regions. Gate silicides 68 and 78 may be formed on top of gate strips 22 and 42, respectively. In these embodiments, gate dielectrics 20 and 40 and gate strips 22 and 42 may not be replaced by gate dielectrics 60 and 70 and metal gates 62 and 72. Accordingly, top portions 52-1 of CESL 52 are used to stop etching in the formation of contact plugs 76 that are connected to gate silicides 68 and 78.

In accordance with one aspect of the embodiment, a method of forming an integrated circuit structure includes providing the integrated circuit structure having a first gate strip and a gate spacer on a sidewall of the first gate strip. A contact etch stop layer (CESL) is formed. The CESL includes a top portion directly over the first gate strip and a bottom portion lower than the top portion. The top portion and the bottom portion are spaced apart from each other by a space. A portion of a sidewall of the gate spacer facing the space has no CESL formed thereon.

In accordance with another aspect of the embodiment, an integrated circuit structure is provided. The integrated circuit structure includes a first gate strip; a gate spacer on a sidewall of the first gate strip; and a contact etch stop layer (CESL) having a bottom portion lower than a top surface of the gate spacer, wherein a portion of a sidewall of the gate spacer has no CESL formed thereon.

The embodiments of the present invention have several advantageous features. By removing sidewall portions of CESL 52, the aspect ratios of the gaps between adjoining gate spacers are reduced. Therefore, the gap filling is less likely to incur voids. This is particularly beneficial for MOS devices formed using the gate-last approach due to the relatively great height of the gate stacks.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
   a first conductive strip;
   a first spacer on a sidewall of the first conductive strip, the first spacer having a convex outermost sidewall;
   a second conductive strip;
   a second spacer on a sidewall of the second conductive strip;
   a gap between the first spacer and the second spacer;
   a top contact etch stop layer (CESL) directly over the first conductive strip;
   a bottom contact etch stop layer (CESL) in the gap and disconnected from the top CESL, wherein a portion of the convex outermost sidewall of the first spacer does not have a CESL formed thereon; and
   an inter-layer dielectric (ILD) in the gap, the ILD adjoining a sidewall of the bottom CESL between the first spacer and the bottom CESL.

2. The integrated circuit structure of claim 1, further comprising a gate dielectric disposed under the first conductive strip and abutting the first spacer.

3. The integrated circuit structure of claim 1, wherein the bottom CESL is spaced apart from the first spacer and the second spacer.

4. The integrated circuit structure of claim 1, further comprising a hard mask over the first conductive strip, the top CESL directly over the hard mask.

5. The integrated circuit structure of claim 1, wherein an outermost edge of the top CESL is physically separated from a nearest outermost edge of the bottom CESL.

6. The integrated circuit structure of claim 1, wherein the top CESL and the bottom CESL are formed of a same material.

7. The integrated circuit structure of claim 1 further comprising a contact plug in the ILD, wherein the contact plug extends through the bottom CESL.

8. An integrated circuit structure comprising:
   a first gate strip on a substrate;
   a first spacer on a sidewall of the first gate strip;
   a second gate strip on the substrate;
   a second spacer on a sidewall of the second gate strip;
   a source/drain structure adjacent the first gate strip and between the first spacer and the second spacer, the source/drain structure comprising a source/drain region;
   a first contact etch stop layer (CESL) directly over and contacting the source/drain structure;
   a second contact etch stop layer (CESL) directly over the first gate strip; and
   an inter-layer dielectric (ILD) over the first CESL, the ILD contacting the first spacer and a sidewall of the first CESL between the first CESL and the first spacer.

9. The integrated circuit structure of claim 8, wherein the first CESL is spaced apart from the first spacer and the second spacer.

10. The integrated circuit structure of claim 8, wherein:
    the source/drain structure further comprises:
       a source/drain silicide, wherein the first CESL and the ILD are directly over and contacting the source/drain silicide of the source/drain structure;
    the integrated circuit structure of claim 8 further comprises:
       a contact plug in the ILD, wherein the contact plug extends into the first CESL and contacts the source/drain silicide of the source/drain structure.

11. The integrated circuit structure of claim 8, further comprising a gate dielectric disposed between the first spacer and the first gate strip.

12. The integrated circuit structure of claim 8, further comprising a gate dielectric disposed between the first gate strip and the substrate.

13. The integrated circuit structure of claim 8, wherein the second CESL has a sidewall that is physically separated from a nearest sidewall of the first CESL.

14. The integrated circuit structure of claim 8, wherein the first CESL and the second CESL are formed of a same material.

15. The integrated circuit structure of claim 8, wherein the ILD is over the second CESL.

16. The integrated circuit structure of claim 8 further comprising a hard mask over the first gate strip, the second CESL directly over the hard mask.

17. A device comprising:
    a first gate strip;
    a first gate spacer on a sidewall of the first gate strip;
    a second gate strip;
    a second gate spacer on a sidewall of the second gate strip;
    a contact etch stop layer (CESL) comprising a bottom portion lower than a top surface of the first gate spacer, the bottom portion disposed between the first gate spacer and the second gate spacer; and
    an inter-layer dielectric (ILD) over and contacting the CESL, the ILD contacting at least a portion of a sidewall of the first gate spacer and at least a portion of a sidewall of the second gate spacer, the ILD contacting a sidewall of the bottom portion of the CESL between the bottom portion and the first gate spacer.

18. The device of claim 17, wherein a top surface of the bottom portion of the CESL is higher than a bottom surface of the first gate spacer.

19. The device of claim 17, wherein the bottom portion of the CESL is spaced apart from the first gate spacer.

20. The device of claim 17 further comprising:
    a source/drain region between the first gate strip and the second gate strip, wherein the bottom portion of the CESL is directly over the source/drain region;

a source/drain silicide over and contacting the source/drain region, wherein the bottom portion of the CESL is directly over and contacting the source/drain silicide; and a contact plug in the ILD, wherein the contact plug extends through the bottom portion of the CESL and contacts the source/drain silicide.

\* \* \* \* \*

UNITED STATES PATENT AND TRADEMARK OFFICE
CERTIFICATE OF CORRECTION

| | | |
|---|---|---|
| PATENT NO. | : 9,218,974 B2 | Page 1 of 1 |
| APPLICATION NO. | : 13/912449 | |
| DATED | : December 22, 2015 | |
| INVENTOR(S) | : Han-Pin Chung et al. | |

It is certified that error appears in the above-identified patent and that said Letters Patent is hereby corrected as shown below:

On the title page, item (54) and in the specification, column 1, line 1, delete "Sidewall Free" and insert --Sidewall-Free--.

Signed and Sealed this
Eighth Day of March, 2016

Michelle K. Lee
*Director of the United States Patent and Trademark Office*